United States Patent
Fink et al.

(10) Patent No.: US 11,901,160 B2
(45) Date of Patent: Feb. 13, 2024

(54) VARIABLE CAPACITOR FOR RF POWER APPLICATIONS

(71) Applicant: COMET AG, Flamatt (CH)

(72) Inventors: Thomas Fink, Staufen (CH); Kevin Häuser, Karlsruhe (DE); Holger Maune, Darmstadt (DE); Daniel Kienemund, Klein-Gerau (DE); Joachim Binder, Karlsruhe (DE); Rolf Jakoby, Rosbach v. d. Höhe (DE); Nicole Bohn, Karlsdorf-Neuthard (DE)

(73) Assignee: Comet AG, Flamatt (CH)

( * ) Notice: Subject to any disclaimer, the term of this patent is extended or adjusted under 35 U.S.C. 154(b) by 265 days.

(21) Appl. No.: 17/437,446

(22) PCT Filed: Mar. 3, 2020

(86) PCT No.: PCT/EP2020/055594
§ 371 (c)(1),
(2) Date: Sep. 9, 2021

(87) PCT Pub. No.: WO2020/182551
PCT Pub. Date: Sep. 17, 2020

(65) Prior Publication Data
US 2022/0189739 A1    Jun. 16, 2022

(30) Foreign Application Priority Data
Mar. 11, 2019  (EP) ..................................... 19162035

(51) Int. Cl.
*H01J 37/32*    (2006.01)
*C04B 35/468*    (2006.01)
(Continued)

(52) U.S. Cl.
CPC ...... *H01J 37/32183* (2013.01); *C04B 35/468* (2013.01); *C04B 35/64* (2013.01); *H01G 4/1218* (2013.01); *H01G 7/06* (2013.01)

(58) Field of Classification Search
None
See application file for complete search history.

(56) References Cited

U.S. PATENT DOCUMENTS 9,171,700 B2    10/2015    Gilmore
11,011,350 B2    5/2021    Abrecht et al.
(Continued)

FOREIGN PATENT DOCUMENTS

CN    101723662 A    6/2010
CN    103578764 A    2/2014
(Continued)

OTHER PUBLICATIONS

Liou, J.W. et al., "Dielectric characteristics of doped Ba1-xSrxTiO3 at the paraelectric state", Materials Chemistry and Physics, 1997, pp. 59-63, vol. 51.
(Continued)

*Primary Examiner* — Dion R. Ferguson
(74) *Attorney, Agent, or Firm* — The Webb Law Firm (57) ABSTRACT

A radio-frequency (RF) power variable capacitor capable of operating at, at least, 50 watts in the MHz range. The capacitor has a composite HDK-NDK ceramic dielectric. The HDK (high dielectric constant) component comprises an active matrix of barium strontium titanate, for example. Acoustic resonances are reduced or eliminated by the addition of a metal or metalloid oxide such as magnesium borate (NDK—low dielectric constant), which acts as an acoustic resonance reduction agent (ARRA) in the RF power domain. The acoustic resonances which previously occurred under
(Continued)

bias voltage 500 V or 1100 V in prior art RF power variable capacitors are eliminated by the addition of the ARRA.

14 Claims, 4 Drawing Sheets

(51) Int. Cl.
  *H01G 4/12* (2006.01)
  *C04B 35/64* (2006.01)
  *H01G 7/06* (2006.01)

(56) References Cited

U.S. PATENT DOCUMENTS

| | | |
|---|---|---|
| 2004/0063566 A1 | 4/2004 | Caspers et al. |
| 2008/0106349 A1 | 5/2008 | McKinzie |
| 2015/0022281 A1 | 1/2015 | Oakes et al. |
| 2018/0233330 A1* | 8/2018 | Abrecht ............ H03H 7/40 |
| 2022/0189739 A1* | 6/2022 | Fink ............ C04B 35/468 |

FOREIGN PATENT DOCUMENTS

| | | |
|---|---|---|
| CN | 107004507 A | 8/2017 |
| EP | 1414047 A1 | 4/2004 |
| EP | 3189538 B1 | 1/2019 |
| JP | 2007294736 A | 11/2007 |
| TW | 201611058 A | 3/2016 |
| WO | 03043037 A2 | 5/2003 |
| WO | 2016034241 A1 | 3/2016 |
| WO | WO-2020182551 A2 * | 9/2020 ........... C04B 35/465 |

OTHER PUBLICATIONS

Zhang et al., "Low Loss, High Tunability of Ba0.4 SR0.6 Ti O3—Mg3 B2 O6 Microwave Composite Ceramics", J. Am. Ceram. Soc., 2010, pp. 2560-2562, vol. 93, No. 9.

* cited by examiner

VARIABLE CAPACITOR FOR RF POWER APPLICATIONS

CROSS-REFERENCE TO RELATED APPLICATIONS

This application is the United States national phase of International Application No. PCT/EP2020/055594 filed Mar. 3, 2020, and claims priority to European Patent Application No. 19162035.0 filed Mar. 11, 2019, the disclosures of which are hereby incorporated by reference in their entirety.

BACKGROUND OF THE INVENTION

Field of the Invention

The disclosure relates to the field of power capacitors suitable for use in radio frequency (RF) power applications such as, for example, dynamic impedance matching of RF power supplied to plasma systems. In particular, the disclosure relates to ceramic dielectrics for such power RF capacitors.

Description of Related Art

RF power capacitors may be used for example for supplying RF power at high voltage and/or high current to a device such as a plasma chamber for a semiconductor fabrication process. The plasma within the plasma chamber presents a load impedance which may vary greatly and rapidly. It is important that the output impedance of the RF power generator for the chamber be closely matched to the rapidly-changing load impedance of the plasma chamber, in order to avoid damaging reflections of power back into the output circuitry of the RF power generator. Reactive components are required, which must be capable of handling the high power (high voltage and/or high current) delivered and the rapidly-varying load. For example U.S. Pat. No. 9,171,700B2 describes a plasma pulse tracking system and method in which impedance matching networks are used which require variable power capacitors. RF frequencies are considered to be from 400 kHz to 162 MHz; a standard operating frequency for an RF power generator would be for example 2 MHz or 6.78 MHz or 13.56 MHz or 27.12 MHz or 40.68 MHz. Variable capacitors allow the capacitance to be adjusted from a value $C_{min}$ to a value $C_{max}$. A variable capacitor is said to be continuously adjustable when any capacitance value between $C_{min}$ and $C_{max}$ can be achieved.

A typical value for $C_{max}$ of a variable power capacitor used for impedance matching at 13.56 MHz may be in the pF range or in the nF range of capacitance values, for example. For a given capacitor design (given by its size, dielectric material type and tuning mechanism, for example), it is desirable to be able to adjust the capacitance in a wide range of values. This property is quantified by the tunability $\tau$ (in %) as follows:

$$\tau = (C_{max} - C_{min})/C_{max}$$

The speed of the variable capacitor is characterized by how much time is necessary to change the capacitance from one value in the $C_{min}$ to $C_{max}$ range to another value in the $C_{min}$ to $C_{max}$ range. It is advantageous to have a short adjustment time, as described below. RF power applications are considered to be those of 50 W or greater, and RF power capacitors must be capable of handling such power at such frequencies.

Traditionally, RF power capacitors have used high vacuum as a dielectric. Variable vacuum capacitors use an actuator mechanism to vary the capacitance of the device by moving the electrodes. More recently, however, it is known from European patent application EP3189538A1, from the same applicant, to use a ferroelectric ceramic material which exhibits paraelectric properties, such as barium strontium titanate, as the dielectric, and to vary the capacitance of the device by applying a varying DC bias voltage of up to 6 kV so as to vary the dielectric constant of the ceramic material.

Using a paraelectric block and an appropriate bias voltage (or equivalently a biasing field) one can achieve for example tunability values of 15% or 30% or even 70% or more. For mechanically-actuated capacitors such as vacuum variable capacitors (in which the electrode positions change instead of the permittivity of the dielectric), it is possible to achieve a tunability of 99% or more. However, the speed of mechanically-actuated capacitors is relatively slow (near 1 second for varying the capacitance) compared to the much faster paraelectric ceramic capacitors necessitating for example only 10 μs to 50 μs or an even shorter time.

The ceramic dielectric of the prior art capacitor of EP3189538A1 may be formed by pressing the powdered material (e.g. barium strontium titanate) into a mold of the desired shape and size (for example a pellet or disk 1 mm thick), and then sintering the pressed pellet at a high temperature (e.g. approximately 1200° C.). The resulting pellet has the necessary dielectric values suitable for operation as an RF capacitor at 13.56 MHz. It is also suitable for use as a variable capacitor with a bias voltage of up to 6 kV, and it is suitable for power applications of 50 W or more. However, in practice, when used under all these conditions combined, i.e. as a variable capacitor with bias voltage of up to 6 kV and operating at RF frequencies and at powers of 50 W or more, the prior art ceramic material has been found to degrade so severely at certain frequencies that it becomes unusable.

There is therefore a need for a variable RF power capacitor with a dielectric which has no, or substantially fewer, frequencies in the RF range at which the dielectric degrades when operating under the combined conditions of high bias voltage and high RF power.

It is known in unrelated technical fields, such as microwave communications, operating in the GHz range, to use miniature variable capacitors formed as a thin film (for example 70 nm thick) or a thick film (for example 30 μm thick) of paraelectric dielectric material, whose relative permittivity varies with applied electric field. However, such capacitors are limited to low-power applications with RMS voltages up to a few tens of volts and RMS currents of a few mA or less. European patent application EP1414047A1 discloses a dielectric for such microwave components, in which the dielectric is made with a uniform, small grain size. However, the advantages of such materials do not hold for large devices for power RF applications. In published US patent application US2015022281A1, the problem of acoustic resonance in small devices is addressed by means of a layered arrangement in which pairs of complementary dielectric layers are arranged so as to cancel out the resonance effects over the device as a whole by destructive interference. US2015022281A1 also describes the use of metal oxide additives for improving the Q-factor of the electrically-variable capacitor. The capacitor of US2015022281A1 uses a metal oxide additive for improving the Q-factor, and a pairwise layered electrode arrangement for reducing acoustic resonance. However, the pairwise electrode arrangement of US2015022281A1 is more difficult to implement in a power RF capacitor, and there is a need for a way of reducing or eliminating acoustic resonances in the dielectric of a power RF variable capacitor without imposing constraints on the dielectric dimensions or the electrode configuration.

SUMMARY OF THE INVENTION

The disclosure aims to overcome at least some of the above disadvantages of prior art power RF variable capacitors. The use of an acoustic resonance reduction agent (ARRA) enables the dielectric to operate as a power RF variable capacitor dielectric, and with higher applied bias voltages, such as 5 kV or 6 kV, across the intended frequency range, without the need to tune the dimensions of the dielectric, and without suffering the kind of acoustic resonances which can render the device unusable. An additional benefit is that, as the presence of the ARRA permits wider tolerances in the dimensions of the dielectric, the dielectric can be shaped and dimensioned to fit design constraints other than those for avoiding acoustic resonance. This can be particularly useful for RF power applications, where insulation and shielding are major design considerations, for example.

Note that references in this text to a dielectric refer to a physical entity, having a particular shape and size, and the term should not be confused with references to a dielectric material, which refers to the substance from which a dielectric can be made.

BRIEF DESCRIPTION OF THE DRAWINGS

The disclosure will be described in detail with reference to the attached drawings, in which.

It should be noted that the FIGS. are provided merely as an aid to understanding the principles underlying the disclosure, and should not be taken as limiting the scope of protection sought. Where the same reference numbers are used in different FIGS., these are intended to indicate similar or equivalent features. It should not be assumed, however, that the use of different reference numbers is intended to indicate any particular degree of difference between the features to which they refer.

DETAILED DESCRIPTION OF THE INVENTION

A ferroelectric ceramic material may be used in its paraelectric phase to form an RF power capacitor whose capacitance is electrically adjustable by varying a high voltage (HV) bias electric field applied across the dielectric. When describing the disclosure, the terms "variable", "adjustable" and "tunable" are used in this description to refer to the changing of the capacitance of a variable capacitor. The term "capacitor" when referring to the disclosure relates to variable capacitors for use in high-power RF applications, in which for example vacuum variable capacitors have hitherto been used, and they are therefore suitable for use in high power delivery systems used, for example, for powering RF plasma etching or coating processes in semiconductor manufacturing industries. Instead of a mechanical adjustment mechanism of the vacuum variable capacitance (whose speed is limited and inherently slow compared to load impedance variations in RF plasma processes), an electric DC bias voltage is used to generate an electric field in the capacitor dielectric.

In order to control the relative permittivity in such RF power applications, the magnitude of the applied DC bias voltage should advantageously be significantly greater than the amplitude of the RF application voltage (for example a factor of 10 greater), so that the effect of the RF voltage on the relative permittivity of the paraelectric dielectric can be neglected compared with the effect of the DC bias voltage. The relative permittivity can thus be controlled and adjusted by varying the DC voltage. The speed of reaction of the permittivity to the applied voltage is essentially instantaneous, since dipole orientations in materials react in nanoseconds or less.

The adjustment of the relative permittivity results directly in an adjustment of the capacitance of a device made with a paraelectric dielectric. The dielectric may be formed as a rectangular block or tablet, or as a disc, for example, with parallel planar conducting electrodes of area A on either side of the dielectric. In this simple geometry, the capacitance is given by $C=\varepsilon_0\varepsilon_r A/d$, where d is the dielectric thickness (distance between the electrodes), $\varepsilon_0$ is the permittivity of vacuum (a physical constant), and $\varepsilon_r$ is the field-dependent (now DC-bias-voltage-dependent) relative permittivity of the dielectric. The term radio frequency (RF) relates to a frequency range which is used in RF power systems, typically between 400 kHz and 200 MHz. A standardized RF power frequency for use in industry is 13.56 MHz, for example, although other standardized RF frequencies are also used for RF power applications, for example 400 kHz, 2 MHz, 6.78 MHz, 13.56 MHz, 27.12 MHz, 40.68 MHz, 60 MHz, 80 MHz, 100 MHz and 162 MHz. References to power RF are intended to refer to applications in which the RF power output may be rated at 50 W or more, such as 100 W or more, or even 1000 W or more, and it is a requirement of RF power capacitors that they be able to handle such power at such frequencies. References to a ceramic material which is "stable at 1200° C." or other temperature refer to a material which is suitable for sintering at the stated temperature.

The inventors have discovered that the prior art BST dielectric is liable to develop major unwanted acoustic resonance at particular RF frequencies when the dielectric is subjected to its biasing field. This kind of acoustic (mechanical) resonance may be associated with piezoelectric characteristics of the ceramic material (BST), for example, and can have such a severe detrimental effect that it can render the device unusable due to excessive mechanical stress and/or due to excessive localized heating in the ceramic material. Note that this effect is distinct from the 'background' electrical losses which typically occur in a ceramic dielectric even when the dielectric is not operating under a high biasing voltage. It has been found that the BST ceramic material of the prior art may be usable in an RF power variable capacitor at frequencies where acoustic resonance is not significant, but not at those frequencies where damaging resonance occurs.

The electrical losses of a capacitor are commonly quantified in terms of the Q factor or Quality factor of a capacitor. This represents the efficiency of a given capacitor in terms of energy losses, and is defined as: $Q=X_c/R_c=1/(2\pi f\ C\ R_c)$ where $X_c$ is the reactance of the capacitor, C the capacitance of the capacitor, Rc is the equivalent series resistance (sometimes abbreviated as ESR) of the capacitor, and f is the frequency at which the measurement is taken. The effect of acoustic resonance at a particular RF frequency under bias voltage may be detected by a significant decrease in the Q-factor at that frequency (referred to as a resonance peak), as discussed below with reference to FIG. 4.

The resonant characteristics of a particular disc-shaped block of ceramic dielectric (hereafter also referred to as a pellet) are principally dependent on the dimensions of the pellet. Such acoustic resonance can be compensated for or cancelled out at individual frequencies by changing the dimensions. The dimensions of the dielectric are critical to the acoustic wave behavior, in particular their resonances or the suppression of their resonances. Changing dimensions typically only shifts a damaging resonance peak to a different frequency. Furthermore, it may not always be an option to adjust dimensions of the pellet in order to eliminate acoustic resonances because the dimensions of the pellet also influence other factors such as the maximum bias and RF voltages which can be applied, and the capacitance values which can be achieved with the capacitor.

Figure 1:
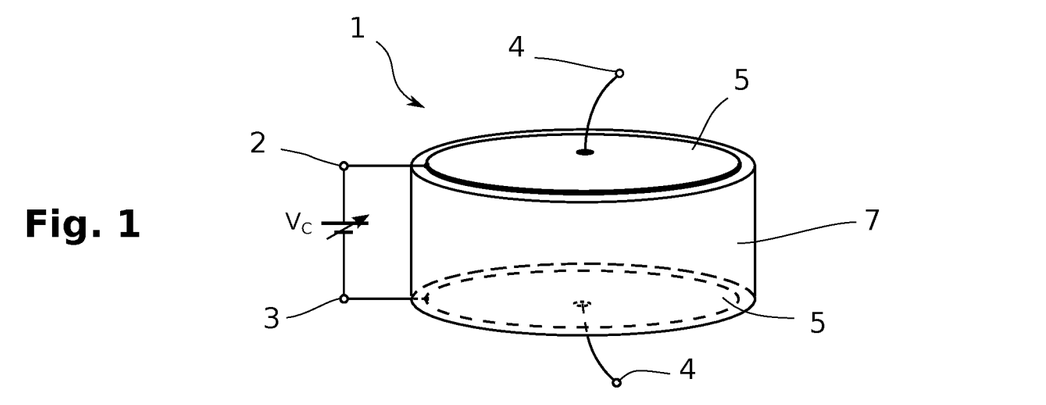
FIG. 1 depicts a schematic isometric view of an example of a dielectric for a variable RF power capacitor.

FIG. 1 shows a simple example of an RF power variable capacitor 1 comprising two RF electrodes 5 separated by a ferroelectric ceramic dielectric 7 operating in its paraelectric phase. RF connections 4 and DC bias voltage connections 2, 3 are provided to the electrodes 5. A variable bias voltage source Vc provides the variable bias voltage between the electrodes 5, and thus across the dielectric 7, thereby altering the capacitance value of the capacitor 1. The larger the applied bias voltage Vc, the lower the capacitance value of the capacitor 1. As indicated in FIG. 1, the dielectric can be fabricated as a contiguous monolithic block of the composite HDK-NDK ceramic material described below. Thanks to the inclusion of an acoustic resonance reduction agent (ARRA) in the dielectric material, the dielectric block can be formed without the kind of layered or interposed electrode arrangement proposed in the prior art, and without the need for tuning the dimensions (e.g. the thickness) of the block to particular operational frequencies measures which would otherwise be needed in order to avoid damaging acoustic resonance (although such interposed electrodes, dimension-tuning or other measures may optionally be included in addition to the ARRA).

Figure 2:
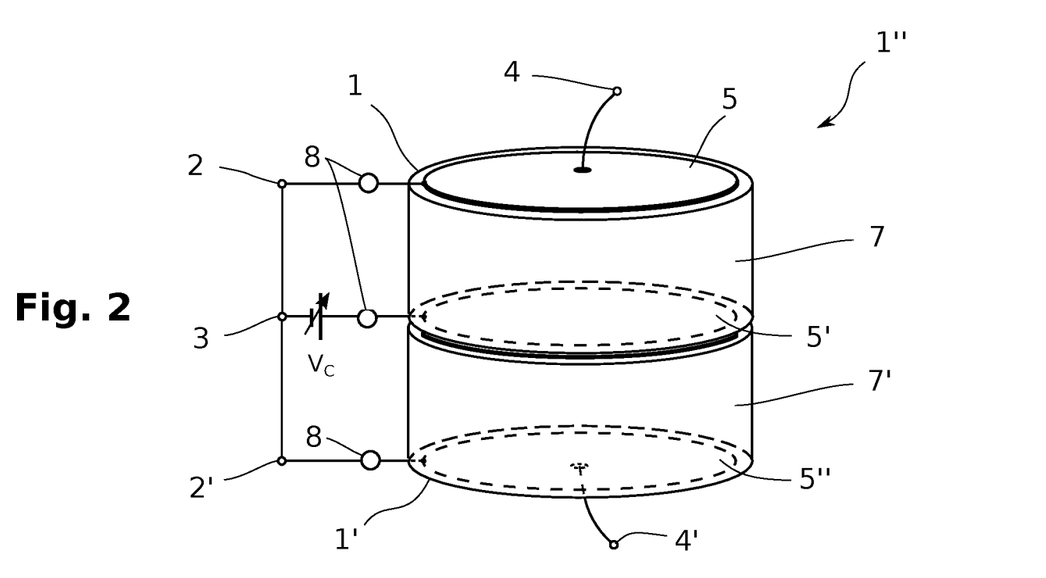
FIG. 2 shows an example of a back-to-back connection arrangement of two such capacitors.

FIG. 2 shows how a pair of capacitors 1 and 1' such as the one depicted in FIG. 1 can be arranged back-to-back so as to provide a dual-capacitor unit 1" whose outer (RF) electrodes 5 and 5" are at substantially the same DC potential, while the high voltage bias voltage Vc is connected to the sandwiched inner electrode 5'. This is just one example of how multiple capacitors may be interconnected. Other configurations can be used. The physical back-to-back arrangement of FIG. 2 may instead be achieved electrically by arranging the two capacitors 1 and 1' physically separate but electrically connected in the same way.

Figure 3:
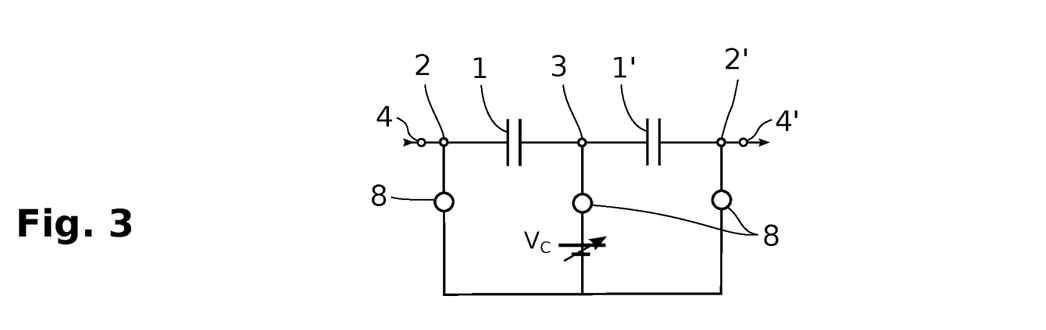
FIG. 3 shows a schematic equivalent circuit diagram of the back-to-back arrangement of FIG. 2.

FIG. 3 shows an electrical schematic of the two-capacitor arrangement of FIG. 2. The RF power is supplied at input contact 4 and the RF output is at output contact 4'. Variable DC bias voltage Vc is connected across capacitor 1 via circuit nodes 2 and 3, and across capacitor 1' via circuit nodes 3 and 2'. FIGS. 2 and 3 also illustrate how filters 8 may be provided to decouple the RF from the Vc bias voltage. Such an arrangement may be required to avoid the bias voltage affecting other connected components, and to avoid the Vc source being affected by the RF power signal. Each decoupling filter 8 may be implemented with resistive or reactive (e.g. LC) components in the conventional manner, for example.

The arrangements shown in FIGS. 1 to 3 are merely examples illustrating how an RF power variable capacitor may be implemented using two RF electrodes separated by a ceramic dielectric. In the example capacitor illustrated in FIG. 1, the RF electrodes are also used as the $V_c$ bias electrodes. Alternatively, one or more of the bias electrodes could be implemented separately from the RF electrodes. It/they may for example be located embedded in the ceramic body of the dielectric 7. The bias electrodes may be electrically insulated from the RF electrodes they may be located such that they are not in electrical contact (and optionally not in physical contact) with the dielectric 7, but nevertheless such that they generate the required electric field in the body of the dielectric 7.

As mentioned above, it has previously been proposed that the dielectric 7 be made of a ferroelectric material such as barium strontium titanate (BST), behaving as a paraelectric material (i.e. above its Curie temperature) at the operating temperature of the capacitor. By judicious choice of composition of the ceramic, the properties of the material can be adjusted so that its Curie temperature is near room temperature, for example the barium to strontium ratio can be selected to bring the Curie temperature to between 0° C. and 50° C., or preferably to between 25° C. and 40° C. This means that the dielectric will be in its paraelectric phase at an operating temperature of 50° C., for example. It has been found that such a dielectric, when fabricated with the dimensions required for an RF power variable capacitor, exhibits acoustic resonance which can be so severe as to render the device unusable at particular frequencies, or even at all. However, the inventors have discovered that it is possible to eliminate or greatly reduce the acoustic resonances without the necessity for fine-tuning the dimensions of the dielectric. By adding a second component (referred to as the acoustic resonance reduction agent) to the ceramic mix before sintering, it is possible to create a composite of a high permittivity and a low permittivity ceramic material (referred to as a composite HDK-NDK ceramic material) in which, at least for the dielectric dimensions required for RF power operation, acoustic resonances are substantially eliminated. Furthermore, the inventors have identified that there exist such compositions in which the required capacitance variability, the required dielectric properties (e.g. dielectric constant, background Q-factor) for RF power applications and the required reduction/elimination of acoustic resonance are all present.

Such a composite HDK-NDK ceramic material may comprise at least 60% (preferably more than 80%) by weight of an active matrix (e.g. BST) as the majority HDK component, and less than 40% (preferably less than 20%) of an acoustic resonance reduction agent, abbreviated as ARRA (e.g. a metal oxide ARRA such as magnesium borate) as the minority NDK component, for example. The German abbreviation HDK indicates a high dielectric constant (e.g. $\varepsilon_r>100$) and NDK a low dielectric constant (e.g. $\varepsilon_r<100$). The active matrix material has a mean grain size of between 0.5 µm and 20 µm, or preferably between 1 µm and 8 µm, or more preferably between 1.5 µm and 5 µm. The NDK should preferably be distributed throughout the active matrix: it has been found that very localized and larger aggregates of NDK component are not as effective in reducing acoustic resonances as well-distributed grains of similar size to those of the HDK component. Preferably the difference in mean grain size of the HDK and the NDK is less than a factor five, more preferably less than a factor two.

Figure 4:
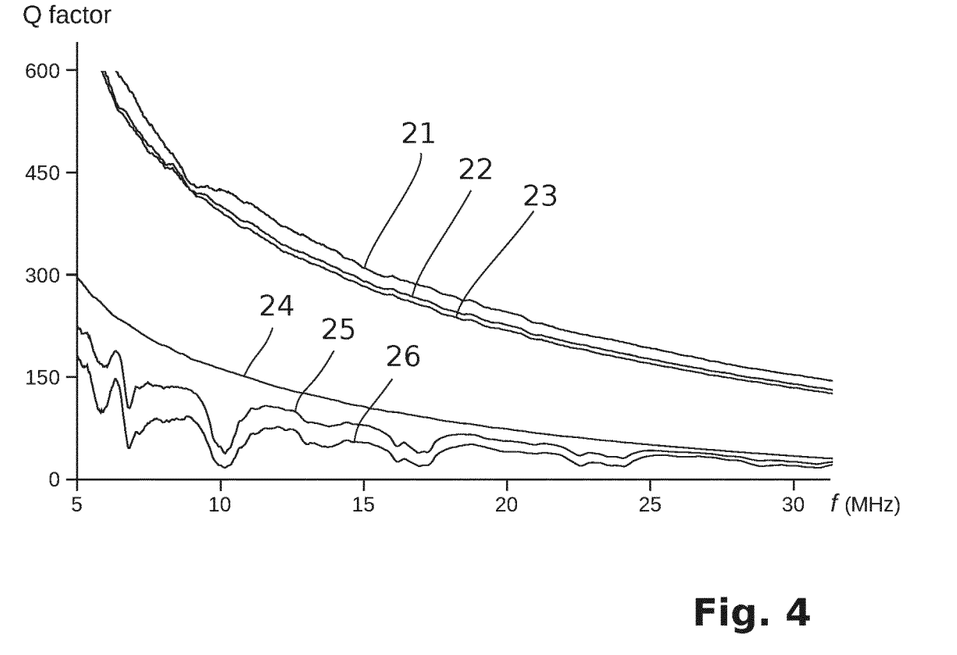
FIG. 4 shows a graph illustrating how the Q-factor of a dielectric may vary with RF frequency of the RF signal applied, comparing the behavior of a capacitor according to the disclosure (curves 21-23) with those of a prior art capacitor (curves 24-26).

FIG. 4 shows (curves 24, 25, 26) how the Q-factor of a prior art ceramic based RF power capacitor varies with applied RF frequency for bias voltages of 0 V, 500 V and 1100 V respectively. As can be seen from curve 24, there is little sign of acoustic resonance effects when the dielectric is unbiased, but curves 25 and 26 show how the acoustic resonance at certain frequencies (e.g. 10.5 MHz, 16 MHz for the particular sample concerned) is reducing the Q-factor to near zero, particularly under higher bias conditions (1100 V for curve 26).

Curves 21, 22 and 23, by contrast, show how the Q-factor varies with the frequency of the applied RF power signal at different bias voltages (curves 21, 22 and 23 correspond to bias voltages of 1100 V, 500 V and 0 V respectively). The Q-factor is not only significantly greater; it also increases slightly with applied bias voltage. More significant for the purposes of the disclosure, however, is that the acoustic resonance peaks which were present in the prior art capacitor under bias voltages of 500 V and 1100 V are no longer present in the capacitor which uses the composite ceramic dielectric including the ARRA as described above.

Figure 5:
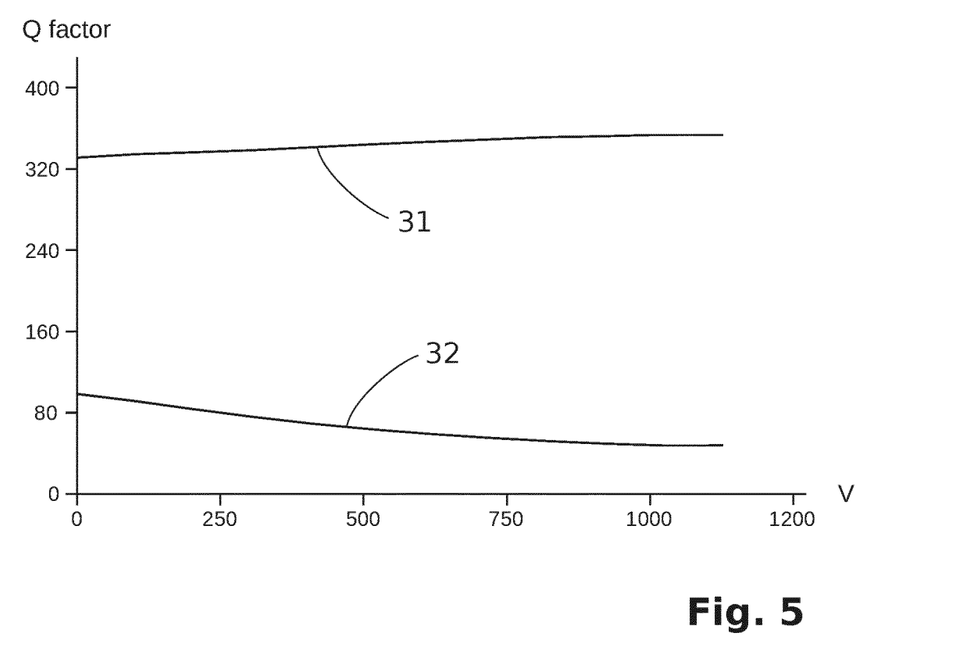
FIG. 5 shows a graph illustrating the variation in Q-factor with applied bias voltage, comparing the behavior of a capacitor according to the disclosure (curve 31) with that of a prior art capacitor (32).

The dielectric is preferably formed as a substantially planar monolithic block or disc having a thickness of between 0.5 mm and 1.5 mm or preferably between 0.6 and 1.2 mm, and having a cross-sectional area in the plane of the block or disk, of at least 20 mm$^2$ or preferably at least 50 mm$^2$, or more preferably at least 100 mm$^2$. This can generate capacitance values of several thousand pF, for example, and is suitable to be biased with voltages up to 6 kV. This high bias voltage allows the permittivity of the dielectric block (in particular a barium strontium titanate dielectric with ARRA) to be adjusted over a wide range, thereby enabling capacitors with tunabilities greater than 15%, or preferably greater than 30%, and up to 40% or up to 50% or more. FIG. 5 shows the variation in Q-factor with applied bias voltage, corresponding to the values for approximately 13 MHz in FIG. 4. Curve 32 shows how the Q-factor of the prior art capacitor decreases with applied voltage, while curve 31 shows how the Q-factor increases with applied bias voltage $V_c$.

Figure 6:
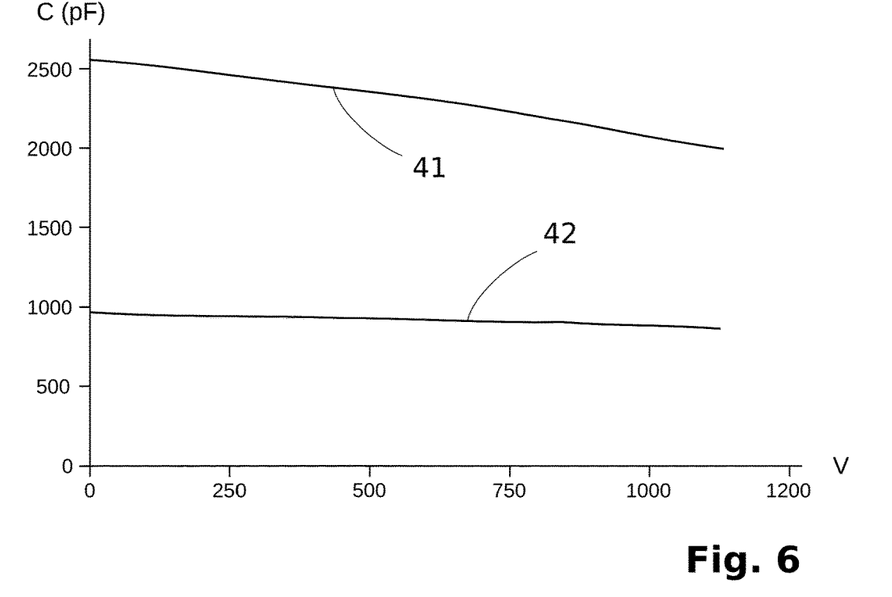
FIG. 6 shows a graph illustrating the variation in capacitance with applied bias voltage, comparing the behavior of a capacitor according to the disclosure (curve 42) with that of a prior art capacitor (41).

FIG. 6 shows how the capacitance of the same devices varies with applied bias voltage. Curve 41 shows how the capacitance of the prior art device decreases more markedly than the capacitance of the device (shown by curve 42) with a dielectric according to the disclosure. The magnitude of the capacitance of the inventive capacitor including the ARRA component is significantly reduced, and the gradient of the curve 42 is significantly shallower than the prior art device. However, the absolute values of the capacitance and the variability of the capacitance are nevertheless suitable for use in an RF power variable capacitor. For a bias voltage range of 0 V to 5 kV, a tunability of 70% or more may be achievable with a BST dielectric known in the prior art (curve 41), whereas the tunability achievable with the dielectric including the ARRA is significantly lower (curve 42), and lies in the range 15% to 50%, for example, for a bias voltage range of 0 V to 5 kV.

Figure 7:
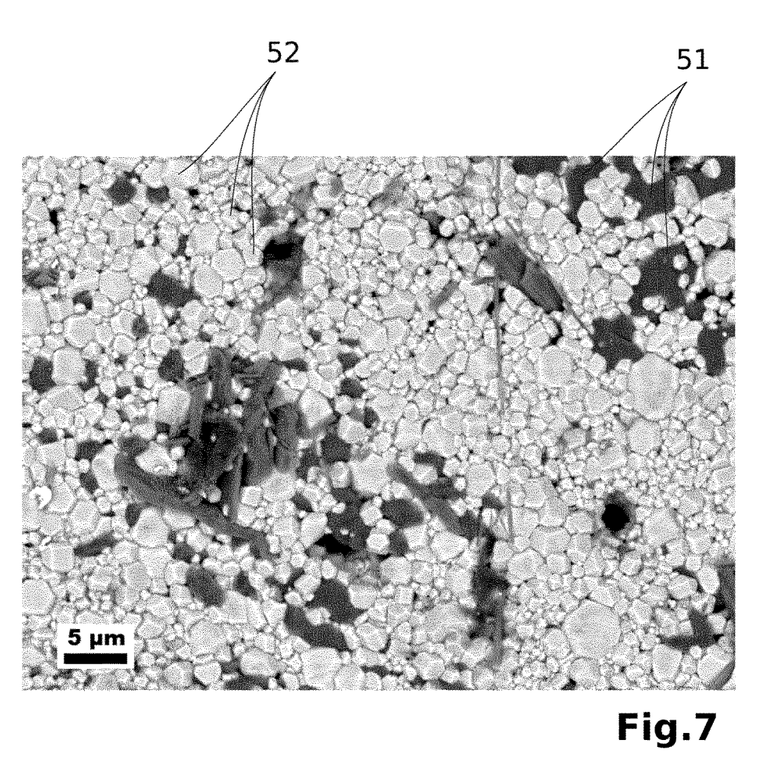
FIG. 7 shows a scanning-electron-microscope image of a sample of a dielectric material suitable for use in a capacitor according to the disclosure.

FIG. 7 shows a scanning electron microscope image of a section through a sample of a dielectric according to the disclosure. In this example, the ARRA 51 is present in the form of grains of a similar size to those of the active matrix 52. The ARRA component grains may, as in this example, have a different morphology from that of the grains of the active matrix (e.g. BST). In this case, part of the ARRA, e.g. in the upper right corner of FIG. 7, is more amorphous (glass-like) than the more crystalline active matrix. In both cases (for the active matrix and the ARRA), the mean grain sizes are preferably similar (e.g. differing by a factor of less than 5, or preferably less than 2).

Figure 8:
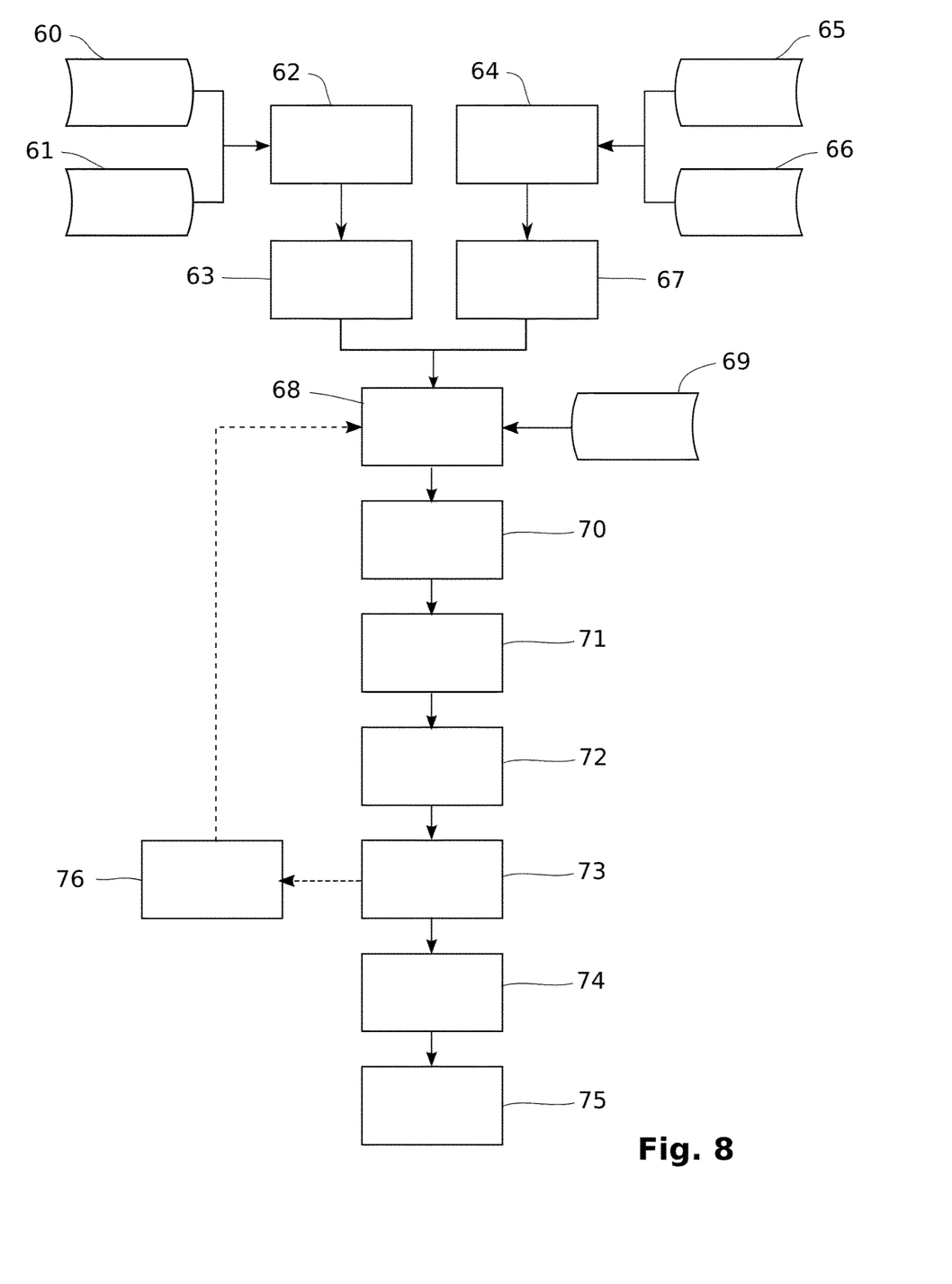
FIG. 8 shows a block flow diagram of an example method according to the disclosure.

FIG. 8 shows a block diagram of an example of a method for manufacturing an RF power variable capacitor as described above. In steps 62 and 63, raw components 60 of the active matrix HDK component of the composite ceramic (such as barium carbonate, strontium carbonate and titanium dioxide) and dopants 61 (such as 0.5% or 1% iron or manganese, for example) are ground together 62 and calcinated 63 to form the base active matrix material. The ARRA material 65, a metal or metalloid oxide, preferably magnesium borate, for example, is ground in step 64, optionally together with other additives or dopants 66, and calcinated in step 67 to form the NDK component of the HDK-NDK composite ceramic. The calcinated active matrix and ARRA components are then re-ground and mixed, in predetermined proportions, in step 68, with additional materials 69, e.g. additives for facilitating the subsequent compression and sintering steps (some may be optional depending on which precise steps are intended). The ground mixture is then dried in step 70, for example by spray drying, pressed into a mold in step 71 and sintered in step 72 to form the ceramic dielectric block, disc, pellet or other shape as required for the capacitor. In step 73, RF electrodes are formed (for example by metallization) on the surfaces of the dielectric, and the bias electrodes are formed if separate bias electrodes are used. In step 74, RF and Vc bias connections are provided to the RF electrodes and bias electrodes respectively. Filter components 8 may be added as described in relation to FIG. 3. Multiple dielectrics 7 may be assembled and connected as described in relation to FIG. 2. In step 75, the capacitor may be provided with insulation, packaging or other finishing features for providing the finished component. Step 76 indicates an iteration which may optionally be performed when customising or prototyping the capacitor. In this step, one or more iterations may be performed with different ratios of ARRA to active matrix, to determine an optimal proportion of ARRA, i.e. the proportion which minimizes the variation in Q-factor with bias voltage, for example, or to address particular acoustic resonances at particular frequencies. In addition, other characteristics of the dielectric can be maximized, such as the Q-factor.

A composite with the following formula has been found to be effective in reducing or eliminating acoustic resonances for a wide range of dielectric geometries and RF frequencies:

Active matrix:

where Fe or other metallic elements may be substituted for Mn,
A=0.6-0.8,
B=0.2-0.4,
C=0-0.015, and
D=0.985-1
ARRA: magnesium borate $Mg_3(BO_3)_2$, for example.
Other metal or metalloid oxides may be usable instead.

The ratio of ARRA to active matrix may be between 40:60 and 5:95, or preferably between 20:80 and 8:92, or more preferably between 10:90 and 5:95 by volume in the sintered state.

The invention claimed is:

1. A radio-frequency (RF) power variable capacitor, capable of operating at at least 50 W, comprising at least two electrodes separated by a dielectric, wherein the capacitance of the capacitor is variable by varying a voltage, denoted by Vc, applied across the at least two electrodes, and wherein:
the dielectric comprises a high dielectric constant-low dielectric constant (HDK-NDK) composite ceramic;
the HDK component forms at least 80% by weight, of the material of the dielectric and comprises an active matrix wherein the active matrix comprises a HDK ferroelectric ceramic material, chosen from barium titanate, strontium titanate, barium-strontium titanate, calcium titanate and barium zirconate titanate;
the NDK component less than 20% by weight, of the dielectric and comprises an acoustic resonance reduction agent (ARRA), wherein the ARRA comprises a metal oxide ceramic which is stable at 1200° C., and wherein the ARRA is distributed throughout the active matrix; and
the active matrix material has a mean grain size between 1.5 µm and 5 µm.

2. The RF power variable capacitor according to claim 1, wherein the active matrix material comprises barium strontium titanate.

3. The RF power variable capacitor according to claim 1, wherein the active matrix has a first mean grain size and the ARRA has a second mean grain size, and wherein the first and second mean grain sizes differ by, at most, a factor of 2.

4. The RF power variable capacitor according to claim 3, wherein the second mean grain size is less than twice the first mean grain size.

5. The RF power variable capacitor according to claim 4, wherein the dielectric is formed as a substantially planar monolithic block or disk having a thickness between 0.6 and 1.2 mm, and having a cross-sectional area in the plane of the block or disk, of at least 100 mm$^2$.

6. The RF power variable capacitor according to claim 1, wherein the metal oxide ceramic is $Mg_3(BO_3)_2$.

7. The RF power variable capacitor according to claim 1, wherein the active matrix material has a Curie temperature between 25° C. and 40° C.

8. The RF power variable capacitor according to claim 1, wherein the capacitor has a tunability of between 15% and 50% for a bias voltage range of 0 V to 5 kV.

9. A method of manufacturing the RF power variable capacitor according to claim 1, comprising:
a first step in which ingredients of the active matrix component are ground and calcinated;
a second step in which ingredients of the ARRA are ground and calcinated;
a third step in which the calcinated active matrix and AARA components are mixed together in a predetermined ratio and ground; and
a fourth step in which the mixed active matrix and ARRA components are dried, pressed, and sintered at a predetermined sintering temperature to form the capacitor dielectric.

10. The method according to claim 9, further comprising a fifth step, in which a plurality of RF electrodes are formed on the dielectric.

11. The method according to claim 9, wherein the sintering temperature is between 1050° C. and 1150° C.

12. The method according to claim 9, further comprising:
an iterative minimizing step in which the ratio of ARRA to active matrix component is adapted, and the third and fourth steps are repeated to determine a value of said ratio which produces a capacitor having a Q-factor value, wherein a dependence of the Q-factor value on a magnitude of a bias voltage has a minimum value, and at which an amount of acoustic resonance at a predetermined frequency has a minimum value.

13. The method according to claim 12, wherein the adapted ratio determined in the minimizing step is used as the predetermined ratio in the third step.

14. The RF power variable capacitor according to claim 1, wherein the active matrix material comprises a HDK ferroelectric ceramic material is a composite of one or more of barium titanate, strontium titanate, barium-strontium titanate, calcium titanate, and barium zirconate titanate.

* * * * *